United States Patent
Daehn

(10) Patent No.: US 6,505,314 B2
(45) Date of Patent: Jan. 7, 2003

(54) METHOD AND APPARATUS FOR PROCESSING DEFECT ADDRESSES

(75) Inventor: Wilfried Daehn, Celle (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/034,920

(22) Filed: Nov. 21, 2001

(65) Prior Publication Data

US 2002/0066057 A1 May 30, 2002

Related U.S. Application Data

(63) Continuation of application No. PCT/EP01/02705, filed on Mar. 10, 2001.

(30) Foreign Application Priority Data

Mar. 23, 2000 (DE) .......................................... 100 14 378

(51) Int. Cl.[7] .............................................. G11C 29/00
(52) U.S. Cl. ...................................... 714/723; 714/718
(58) Field of Search ................................. 365/201, 200; 714/42, 718, 723, 720, 719

(56) References Cited

U.S. PATENT DOCUMENTS 5,357,473 A * 10/1994 Mizuno et al. ............. 365/201
5,737,269 A * 4/1998 Fujita ........................ 365/200
5,909,448 A   6/1999 Takahashi .................. 365/201
5,910,921 A   6/1999 Beffa et al. ................ 365/201
6,249,884 B1 * 6/2001 Joo ............................ 714/42
6,320,804 B2 * 11/2001 Dahn ......................... 365/201

FOREIGN PATENT DOCUMENTS

DE 199 63 689 A 1 7/2001

OTHER PUBLICATIONS

"High Speed Redundancy Processor" (Bosse), 1984 International Test Conference, Paper No. 9.4, pp. 282–286.

* cited by examiner

Primary Examiner—David Ton
(74) Attorney, Agent, or Firm—Laurence A. Greenberg; Werner H. Stemer; Gregory L. Mayback

(57) ABSTRACT

A method and apparatus for processing defect addresses includes a reduced number of defect addresses to the extent necessary for later evaluation of the defect situation. Preferably, defect addresses are not stored when more than a predetermined number of defects are known for a column in the case of column-by-column checking of a matrix-type memory or per row in the case of row-by-row checking of a matrix-type memory.

14 Claims, 5 Drawing Sheets

FIG. 4

FUNCTION TABLE:

| | FB | VBl | BEl | REl | CEl | VBr | BEr | REr | CEr | Row | Col | Load | fail bit |
|---|---|---|---|---|---|---|---|---|---|---|---|---|---|
| 1 | o | — | — | — | — | — | — | — | — | — | — | o | o |
| 2 | — | o | — | — | — | — | — | — | — | — | — | — | — |
| 3 | — | — | o | — | — | — | — | — | — | — | — | — | — |
| 4 | — | — | — | o | o | — | — | — | — | — | — | — | — |
| 5 | — | — | — | o | — | o | — | — | — | — | — | — | — |
| 6 | — | — | — | o | — | — | o | — | — | — | — | — | — |
| 7 | — | — | — | o | — | — | — | o | o | — | — | — | — |
| 8 | — | — | — | o | — | — | — | o | — | o | o | o | o |
| 9 | — | — | — | o | — | — | — | o | — | o | — | — | — |
| 10 | — | — | — | o | — | — | — | o | — | — | — | — | — |
| 11 | — | — | — | o | — | — | — | — | o | — | — | o | o |
| 12 | — | — | — | o | o | — | — | — | — | o | o | — | — |
| 13 | — | — | — | o | o | — | — | — | — | o | — | — | — |
| 14 | — | — | — | — | o | — | — | — | — | — | — | — | — |
| 15 | — | — | — | — | o | o | — | — | — | — | — | — | — |
| 16 | — | — | — | — | o | — | o | — | — | — | — | — | — |
| 17 | — | — | — | — | o | — | — | o | o | — | — | o | o |
| 18 | — | — | — | — | o | — | — | o | — | o | — | — | — |
| 19 | — | — | — | — | o | — | — | — | o | o | o | — | — |
| 20 | — | — | — | — | o | — | — | — | o | — | o | o | o |
| 21 | — | — | — | — | o | — | — | — | — | o | — | — | — |
| 22 | — | — | — | — | o | — | — | — | — | — | o | — | — |
| 23 | — | — | — | — | o | — | — | — | — | — | o | o | o |
| 24 | — | — | — | — | o | — | — | — | — | — | — | o | — |
| 25 | — | — | — | — | — | — | — | — | — | — | — | o | o |

FIG. 5

| | column 1 | column 2 | column 3 | column 4 | column 5 | column 6 | column 7 | column 8 | red. column 1 | red. column 2 | |
|---|---|---|---|---|---|---|---|---|---|---|---|
| row 1 | | | | | | | | defect. | | | row block 1 |
| row 2 | | | | | defect. | | | | | | |
| row 3 | | | | | defect. | | | defect. | | | row block 2 |
| row 4 | | | | | | | | | | | |
| row 5 | | | | | | | | | | | row block 2 |
| row 6 | | | | | | | | | | | |
| row 7 | | | | | | | | | | | row block 2 |
| row 8 | | | | | | | | | | | |
| red. row 1 | | | | | | | | | | | red. row block 1 |
| red. row 2 | | | | | | | | | | | |
| | column block 1 | | column block 2 | | column block 3 | | column block 4 | | red. column block | | |

METHOD AND APPARATUS FOR PROCESSING DEFECT ADDRESSES

CROSS-REFERENCE TO RELATED APPLICATION

This application is a continuation of copending International Application PCT/EP01/02705, filed Mar. 10, 2001, which designated the United States.

BACKGROUND OF THE INVENTION

FIELD OF THE INVENTION

The invention relates to a method and an apparatus for processing defect addresses as are used, for example, in the testing of a semiconductor memory.

After fabrication, every semiconductor module is checked by a test device to determine whether or not fabrication was effected correctly and the semiconductor module has a correct mode of operation. To that end, in the case of a semiconductor memory, for example, each memory cell is checked for a correct mode of operation. In the course of such checking, in a matrix memory, the test device proceeds either column by column or row by row, so that all the rows are checked for a column and then the next column is selected, for which, in turn, all the rows are tested, or all the columns are checked for a row and then all the columns are checked for the next row.

If a defective memory cell is identified, then its address is stored in a defect memory. Because, in particular, in a matrix memory, there are a very large number of memory cells present, a relatively large memory array has to be kept available for corresponding storage of the defect addresses. Because the memory array is usually stored on the semiconductor module, part of the storage capacity of the semiconductor module is required for defect storage.

SUMMARY OF THE INVENTION

It is accordingly an object of the invention to provide a method and apparatus for processing defect addresses that overcomes the hereinafore-mentioned disadvantages of the heretofore-known devices and methods of this general type and that reduces the number of defect addresses determined when checking for defects in a semiconductor component.

With the foregoing and other objects in view, there is provided, in accordance with the invention, a method for processing addresses of defective elements of a memory component, including the steps of checking the memory component for a correct mode of operation with a predetermined test program, comparing an address of an element with predetermined address ranges, assigning the address to an address range, using the address of the address range to which the address was assigned for the element, comparing the address of the defective element with defect addresses of elements already identified as defective if an element of the memory component is identified as defective, storing the address as a new defect address if the address does not correspond to one of the defect addresses, and not storing the new address if the address corresponds to one of the defect addresses.

In accordance with another mode of the invention, the last four steps are repeated.

In accordance with a further mode of the invention, the address is compared with the defect address stored last as a defect address, a predeterminable number k of defect addresses stored last are compared with one another, and if the address corresponds to the defect address stored last and if the address corresponds to the last k stored defect addresses the address is not stored as a defect address.

In accordance with an added mode of the invention, one of a column address and a row address of a memory element is used as the address in a matrix-type semiconductor memory.

With the objects of the invention in view, there is also provided an apparatus for processing addresses of defective elements determined by a test apparatus, including an evaluation unit, a comparison device connected to the evaluation unit and having a memory configuration with memory arrays connected in series, and comparitors for comparing a newly determined address with an address stored in a first of the memory arrays, some of the comparitors respectively provided for two of the memory arrays one connected downstream of another, the some comparitors comparing addresses stored in the two memory arrays, the some comparitors forwarding an evaluation signal to the evaluation unit if the addresses correspond, and a defect memory. The evaluation unit outputs a command for storing the newly determined address in the defect memory and in the first memory array if the newly determined address does not correspond to the address stored in the first memory array.

In accordance with an additional feature of the invention, the comparison device advances an address previously stored in the first memory array into a second of the memory arrays if the newly determined address is written to the first memory array.

In accordance with yet another feature of the invention, a number k of the memory arrays are connected in series and the address previously stored in a $(k-1)^{th}$ memory array is advanced into a $k^{th}$ memory array if the newly determined address is read into the first memory array.

In accordance with yet a further feature of the invention, the evaluation unit outputs a command for storing the newly determined address in the defect memory if the same addresses are not stored in a number k of successive ones of the memory arrays connected in series.

In accordance with yet an added feature of the invention, there is provided a preprocessing unit connected to the comparison device and to the evaluation unit, the preprocessing unit receiving the addresses upstream of the comparison device, the preprocessing unit comparing the addresses with predetermined address ranges and assigning the addresses to an address range, and the preprocessing unit forwarding to the comparison device the address of the address range to which the address was assigned.

In accordance with a concomitant feature of the invention, there are provided bank comparison devices, row comparison devices, column comparison devices, a bank evaluation circuit, a row evaluation circuit, a column evaluation circuit, and a decision circuit, and the memory configuration has memory rows, a number of k memory rows are connected in series, a respective one of the memory rows has three memory arrays including a bank address array, a row address array, and a column address array, the bank address arrays, the row address arrays, and the column address arrays of respective ones of the memory rows are connected in series, one of the bank comparison devices is respectively connected to two of the bank address arrays, one of the row comparison devices is respectively connected to every two of the row address arrays, one of the column comparison devices is respectively connected to every two of the column address arrays, all 2 to $k^{th}$ bank comparison devices are connected to the bank evaluation circuit, all 2 to $k^{th}$ row comparison devices are connected to the row evaluation circuit, all 2 to k$^{th}$ column comparison devices are connected to the column evaluation circuit, and the bank evaluation circuit, the row evaluation circuit, and the column evaluation circuit are connected to the decision circuit.

Other features that are considered as characteristic for the invention are set forth in the appended claims.

Although the invention is illustrated and described herein as embodied in a method and apparatus for processing defect addresses, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 4 is a table detailing the logic evaluation of the evaluation unit of FIG. 3; and FIG. 5 is a table detailing a defect configuration in a semiconductor memory according to the invention.

DESCRIPTION OF THE PREFERRED EMBODIMENTS

Figure 1:
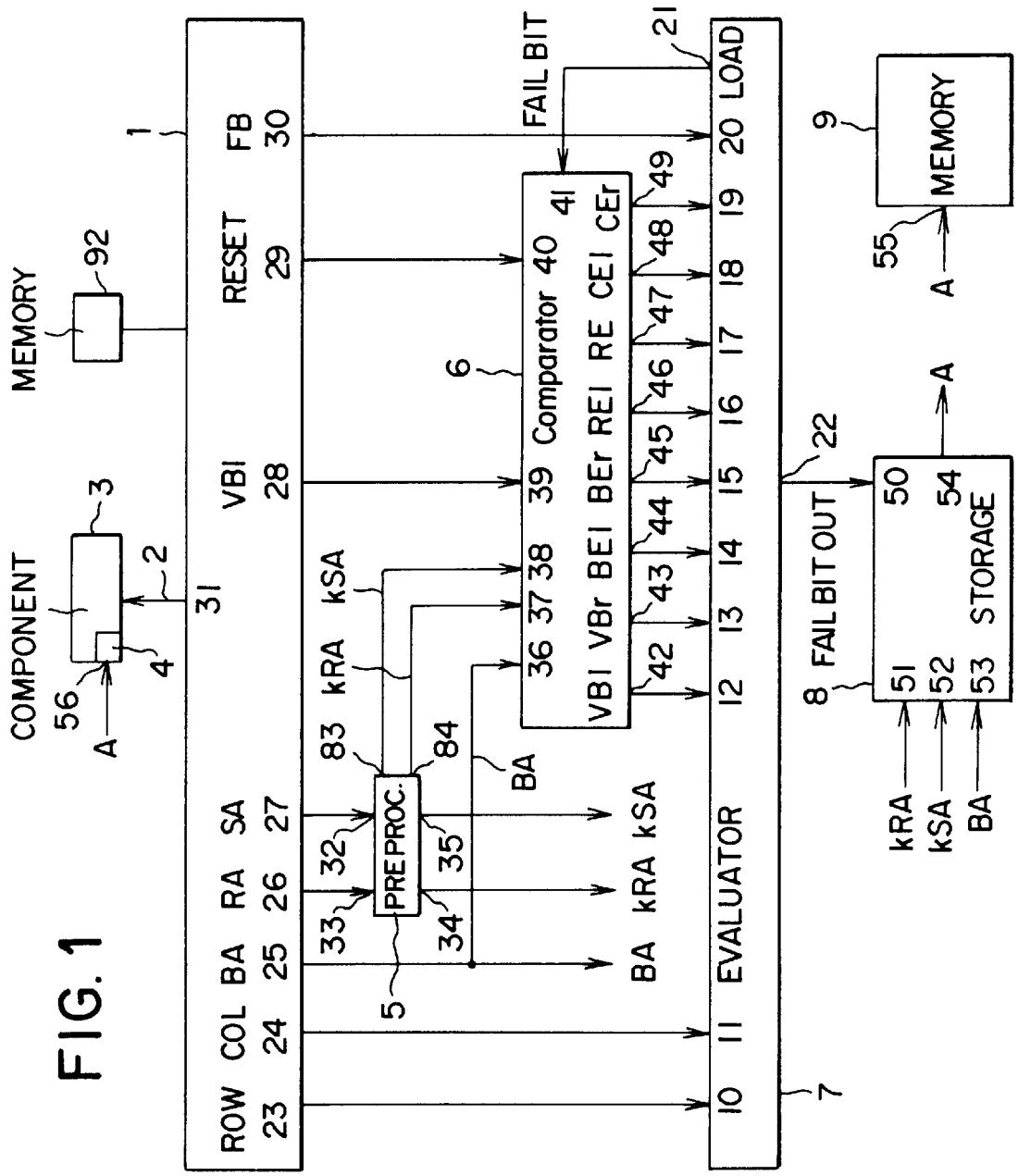
FIG. 1 is a block circuit diagram of a test configuration for determining and storing defect addresses according to the invention.

Referring now to the figures of the drawings in detail and first, particularly to FIG. 1 thereof, there is shown a test device 1 that is connected to a semiconductor component or module 3 through a data input and output 31 with data lines 2. Data is exchanged with the semiconductor component 3 through the data lines 2. The test device 1 is connected to a program memory 92, in which test programs for checking the semiconductor module 3 are stored. The test device 1 checks the mode of operation of the semiconductor component 3 with the aid of the test programs. The semiconductor component 3 has a defect memory 4, to which defect addresses can be written. The test device 1 is connected to a first input 10 of an evaluation unit 7 through a third output 23, to a second input 11 of the evaluation unit 7 through a fourth output 24, and to an eleventh input 20 of the evaluation unit 7 by a tenth output 30. Furthermore, the test device 1 is connected to a fourteenth input 36, a seventeenth input 39, and an eighteenth input 40 of a comparison device 6 through a fifth output 25, an eighth output 28, and a ninth output 29. Moreover, the fifth output 25 of the test device 1 is connected to a twenty-third input 53 of the storage unit 8. Furthermore, the test device 1 is connected to a thirteenth input 33 and a twelfth input 32 of a preprocessing unit 5 by a sixth output 26 and a seventh output 27.

The preprocessing unit 5 has an eleventh and a twelfth output 34, 35 that are connected to a twenty-first and a twenty-second input 51, 52 of a storage unit 8. Moreover, the preprocessing unit 5 has a twenty-second and a twenty-third output 83, 84 that are connected to a fifteenth and a sixteenth input 37, 38 of the comparison device 6.

The comparison device 6 has a thirteenth, fourteenth, fifteenth, sixteenth, seventeenth, eighteenth, nineteenth, and twentieth outputs 42, 43, 44, 45, 46, 47, 48, 49 that are connected, respectively, to a third, fourth, fifth, sixth, seventh, eighth, ninth, and tenth inputs 12, 13, 14, 15, 16, 17, 18, 19 of the evaluation unit 7.

The evaluation unit 7 has a first output 21 that is connected to a nineteenth input 41 of the comparison device 6. Furthermore, the evaluation unit 7 has a second output 22 that is connected to a twentieth input 50 of the storage unit 8. The storage unit 8 has a twenty-first output 54 that is connected either to a first write input 55 of an external defect memory 9 or to a second write input 56 of the defect memory 4.

The mode of operation of the test configuration of FIG. 1 is explained in more detail as follows: test methods with which the test device 1 checks the correct mode of operation of the semiconductor component 3 are stored in the program memory 92. The semiconductor component 3 is, for example, a matrix-type semiconductor memory whose memory elements are checked by the test device 1. A matrix-type semiconductor memory has a plurality of memory banks each constructed in the form of a matrix. The individual memory elements are addressable with row addresses and with column addresses through row lines and column lines. For such a purpose, the test device 1 uses two different procedures.

In a first procedure, the test device 1 selects a row line of the semiconductor memory and, for the row line, checks all the column lines connected to the row line. During the procedure, the datum ROW is set to 1 and forwarded through the third output 23 to the first input 10 of the evaluation unit 7. Furthermore, the datum COL is set to 0 and is forwarded through the fourth output 24 to the second input 11 of the evaluation unit 7. The datum COL with the value 0 specifies that the memory elements are not being checked column by column. The datum ROW with the value 1 specifies that the memory elements are being checked row by row.

Furthermore, the test device 1 passes, through the fifth output 25, the bank address BA selected for the test firstly through the fourteenth input 36 to the comparison device 6 and through the twenty-third input 53 to the storage unit 8. The bank address specifies which memory bank is being checked. Furthermore, the test device 1 passes, for the memory element that is currently to be checked, both the row address RA and the column address SA through the sixth and seventh outputs 26, 27 to the thirteenth and twelfth inputs 33, 32 of the preprocessing unit 5, respectively.

Moreover, the test device 1 passes, through the eighth output 28, a valid bit to the seventeenth input 39 of the comparison device 6. The valid bit is always set to 1.

Also, the test device 1 passes, through the ninth output 29, a reset signal to the eighteenth input 40 of the comparison device 6. The reset signal is normally 0 and is set once to 1 at the beginning of a module test in order to erase all the information in the processing unit 6 at the beginning of the test.

If the test device 1 identifies a defective memory element, then the test device 1 sets a defect bit FB to the value 1 and passes the bit FB through the tenth output 30 to the eleventh input 20 of the evaluation unit 7.

The preprocessing unit 5 checks the row address RA and the column address SA with predetermined row blocks and column blocks. The row block and the column block containing the supplied row address RA or column address SA are determined as such. The row blocks and the column blocks represent a number of row lines or column lines disposed next to one another on the semiconductor memory that are completely repaired in the event of a repair of the semiconductor memory. By way of example, ten rows or columns are always combined to form a row block or column block. Memory arrays include orthogonal rows and columns of memory cells. In the case of a defect, the repair is effected by exchanging a block of a plurality of rows lying one above the other or a plurality of columns lying next to one another. Row blocks of the size 1 are rows. Column blocks of the size 1 are columns. The size of the blocks is defined during the construction of the memory and determines the possibilities for repairing a defective memory array. If the memory is subdivided into a small number of large row and column blocks that can be replaced, the configuration simplifies the repair method. In the case of subdivision into a large number of small blocks, the configuration increases the flexibility of the repair method but at the same time increases the complexity of the circuit.

By way of example, if the number of rows or columns that are combined to form a row block or column block, respectively, is a power of 2, the address of the row or column block may, in the simplest case, be made only of the more significant bits of the row or column address, while the less significant address bits define the position of the row or column in the row or address block.

It has been shown that defects, if they occur, occur with fairly high probability in blocks next to one another or above one another in a matrix array. Therefore, row blocks or column blocks are always repaired in the event of a repair of the semiconductor memory. If the test device 1 has identified a defect for a row address or a column address, then a predetermined number of k row addresses or k column addresses are replaced instead of the defective row or column address during the repair. Consequently, it suffices for the information in the defect memory if, for a plurality of defective memory elements situated in a row block or in a column block, only one defect address is stored, to be precise that of the memory block or column block to be repaired. As such, memory space is saved.

The preprocessing unit 5 passes to the twenty-first and twenty-second inputs 51, 52 of the storage unit 8, through the eleventh and twelfth outputs 34, 35, the memory block and/or the column block in which resides the column or row address that identifies the memory element that has been determined as defective. Equally, the preprocessing unit 5 forwards to the fifteenth and sixteenth inputs 37, 38 of the comparison device 6, through the twenty-second and twenty-third outputs 83, 84, the address of the column block and/or of the row block in which resides the row address or column address of the memory element that has been identified as defective.

Figure 2:
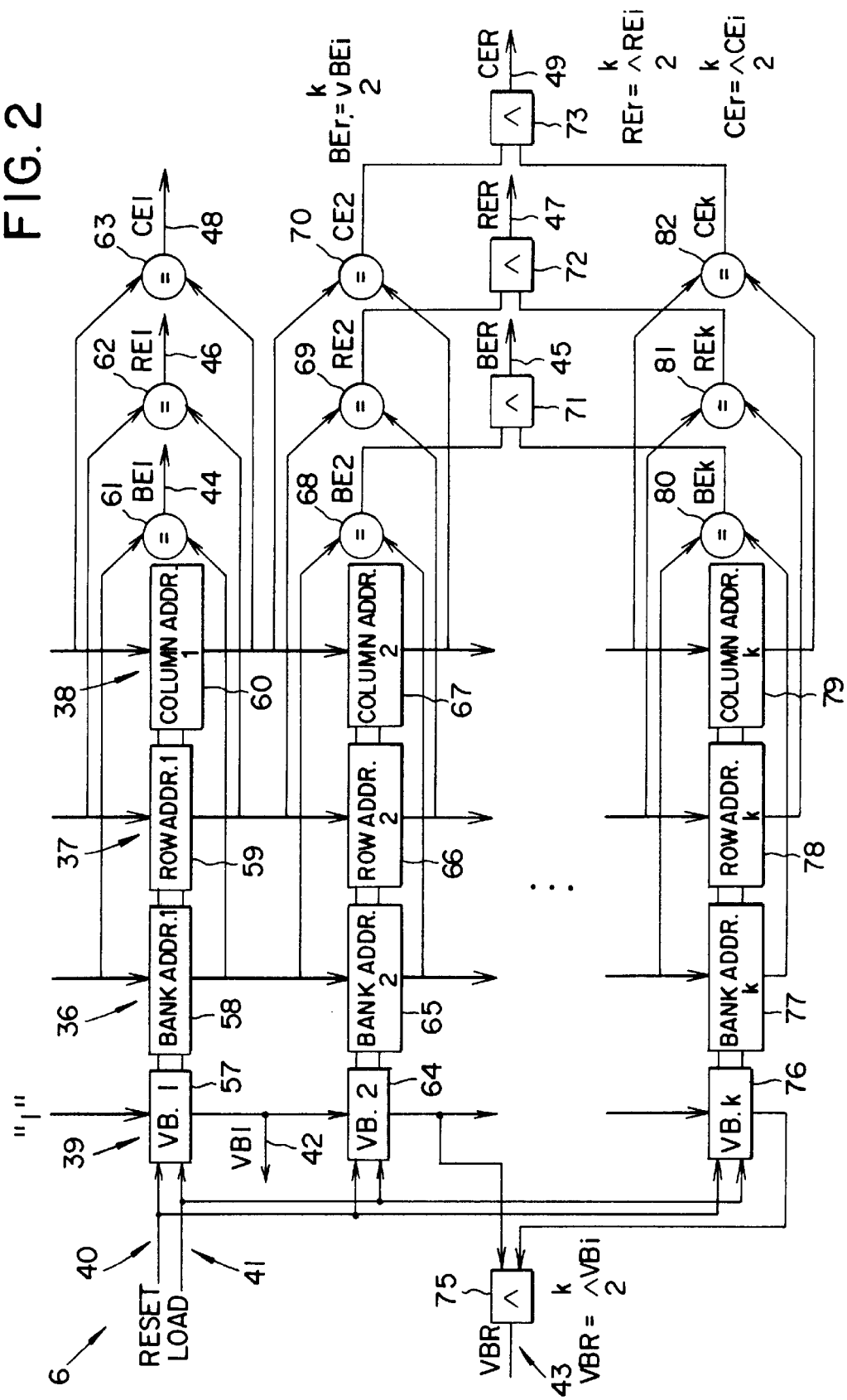
FIG. 2 is a block and schematic circuit diagram of an embodiment of the comparison device of FIG. 1.

The construction of the comparison device 6 is illustrated in detail in FIG. 2. The comparison device 6 has a first value memory 57, a first bank memory array 58, a first row memory array 59, and a first column memory array 60. Furthermore, a first address comparison device 61, a second address comparison device 62, and a third address comparison device 63 are provided. The first address comparison device 61 is connected to an input and to an output of the first bank memory array 58. The second address comparison device 62 is connected to an input and an output of the first row memory array 59. The third address comparison device 63 is connected to an input and an output of the first column memory array 60. The first, second, and third address comparison devices 61, 62, 63 compare the address that has been newly written to the first bank memory array or first row memory array or first column memory array, respectively, with the address output from the first bank memory array or first row memory array or first column memory array, respectively, and determine, separately for bank, row and column, the value 1 if the two corresponding addresses match, and the value 0 if the corresponding two addresses are different. The address output through the output from the first bank memory array 58, the first row memory array 59, and the first column memory array 60 identifies the address of a defective memory element that was determined last by the test device 1. The first, second, and third address comparison devices 61, 62, 63 forward the values determined to the evaluation unit 7 through the fifteenth, seventeenth, and nineteenth outputs 44, 46, 48, respectively. The first value memory 57, in which the first valid bit VB1 is stored, specifies by a value 1 that the new bank, row, and column address has been compared with a valid defect address in the first bank memory array 58, in the first row memory array 59, and in the first column memory array 60. If the value of the first value memory VB1 is equal to 0, then no valid address is stored in the first bank memory array 58, in the first row memory array 59, and in the first column memory array 60. Such is the case, e.g., directly at the beginning of the module test, after all the items of information have been erased in the processing device 6.

The comparison device 6 furthermore has a second value memory 64, a second bank memory array 65, a second row memory array 66, and a third column memory array 67. The first value memory 57 is connected to the second value memory 64, the first bank memory array 58 is connected to the second bank memory array 65, the first row memory array 59 is connected to the second row memory array 66, and the first column memory array 60 is connected to the second column memory array 67.

Also provided are a fourth, fifth, and sixth address comparison device 68, 69, 70. The fourth address comparison device 68 is connected to the input and to the output of the second bank memory array 65, the fifth address comparison device 69 is connected to the input and the output of the second row memory array 66, and the sixth address comparison device 70 is connected to the input and output of the second column memory array 67. The fourth, fifth and sixth address comparison devices 68, 69, 70 operate in a manner corresponding to the first, second, and third address comparison devices 61, 62, 63. The output signal of the fourth address comparison device 68 is fed to a first AND comparison device 71, the output signal of the fifth address comparison device 69 is fed to a second AND comparison device 72, and the output signal of the sixth address comparison device 70 is fed to a third AND comparison device 73.

Altogether, a number k of value memories, a number k of bank memory arrays, a number k of row memory arrays, and a number k of column memory arrays are provided, which are indicated with the ellipses in FIG. 2. The k value memories, the k bank memory arrays, the k row memory arrays, and the k column memory arrays are coupled to one another in the form of serial memory cascades.

The configuration of the memory of the comparison device 6 is constructed in the form of memory rows. A value memory, a bank memory array, a row memory array, and a column memory array are associated respectively with a memory row. Furthermore, an evaluation configuration is provided for each memory row. A respective AND comparison device is provided for the bank memory array, the row memory array, and the column memory array. The memory row and the evaluation configuration constitute a processing row. K processing rows are provided in the comparison device 6. For ease of illustration, only the first two processing rows and the last, the $k^{th}$, processing row are represented.

The $k^{th}$ processing row has a $k^{th}$ value memory 76, a $k^{th}$ bank memory array 77, a $k^{th}$ row memory array 78, and a $k^{th}$ column memory array 79. A seventh address comparison device 80 is connected to the input and output of the $k^{th}$ bank memory array 77, an eighth address comparison device 81 is connected to the input and output of the $k^{th}$ row memory array 78, and a ninth address comparison device 82 is connected to the input and output of the $k^{th}$ column memory array 79. The seventh, eighth, and ninth address comparison devices 80, 81, 82 function in a manner corresponding to the first, second and third address comparison devices 61, 62, 63. The output values of the seventh, eighth, and ninth address comparison devices 80, 81, 82 are passed to the first and second and third AND comparison devices 71, 72, 73, respectively.

Equally, the address comparison devices of the memory rows that are not illustrated are likewise connected to the first and second and third AND comparison devices 71, 72, 73, respectively.

The AND comparison devices 71, 72, 73 function such that a 1 is output as the output signal if all the inputs have the value 1, otherwise the value 0 is output as the output signal.

The output signal BER of the first AND comparison device 71, which is designated as bank evaluation signal, is output through the sixteenth output 45 to the sixth input 15, the output signal RER of the second AND comparison device 72, which is designated as row evaluation signal, is output through the eighteenth output 47 to the eighth input 17, and the output signal CER of the third AND comparison device, which is designated as column evaluation signal, is output through the twentieth output 49 to the tenth input 19 of the evaluation unit 7.

The output of the first value memory 57 is connected to the third input 12 of the evaluation unit 7 through the thirteenth output 42. As such, the value of the first valid bit VB1 is forwarded to the evaluation unit 7.

The eighteenth input 40, through which the reset signal is fed, and the nineteenth input 41, through which the Load signal is fed, are connected to each value memory 57, 64, 76, to each bank memory array 58, 65, 77, to each row memory array 59, 66, 78, and to each column memory array 60, 67, 69. As such, the content of the value memories, of the bank memory arrays, of the row memory arrays, and of the column memory arrays can be erased by a reset signal. Furthermore, the Load signal can be used to initiate a transfer of the value in the $n^{th}$ value memory, in the $n^{th}$ bank memory array, in the $n^{th}$ row memory array, and in the $n^{th}$ column memory array of the $n^{th}$ memory row into the $(n+1)^{th}$ value memory, into the $(n+1)^{th}$ bank memory array, into the $(n+1)^{th}$ row memory array, and into the $(n+1)^{th}$ column memory array, respectively, of the $(n+1)^{th}$ memory row. The Load signal is passed from the evaluation unit 7 through the first output 21 to the nineteenth input 41 of the comparison device 6. If the Load signal has the value 1, then the new address is written to the first bank memory array, the first row memory array, and the first column memory array. Furthermore, the first value memory 57 is occupied by the value 1. Moreover, the addresses of the $(n-1)^{th}$ bank memory array, of the $(n-1)^{th}$ row memory array, of the $(n-1)^{th}$ column memory array, and of the $(n-1)^{th}$ value memory are written to the $n^{th}$ bank memory array, the $n^{th}$ row memory array, the $n^{th}$ column memory array, and the $n^{th}$ value memory, respectively.

The two to $k^{th}$ value memories 64, 76 are connected to a fourth AND comparison device 75. The fourth AND comparison device 75 functions in a manner corresponding to the first AND comparison device 71. The fourth AND comparison device 75 outputs a 1 as the output signal through the fourteenth output 43 if all two to $k^{th}$ value memories 64, 76 have the value 1, otherwise the fourth AND comparison device 75 outputs the value 0. The output of the fourth AND comparison device 75 is connected to the fourth input 13 of the evaluation unit 7. The value memories 64, 76 have the value 1 if a respective address is stored in the memory row for the bank memory array, the row memory array, and the column memory array.

FIG. 2 functions as follows: the content of all the value memories is set to "0" at the beginning of the test to indicate that the associated memories of bank addresses, column block addresses, and row block addresses do not yet contain valid data. As soon as a defect address, including a bank address, a column block address, and a row block address, is accepted into the address memory, a "1" is written to the corresponding value memory and it is, thus, indicated that the results of address comparisons are valid. After identification of a defective memory element, the test device 1 passes a defect bit FB to the eleventh input 20 of the evaluation unit 7. Moreover, the test device 1 passes the row address and the column address of the defective memory element to the preprocessing unit 5. The preprocessing unit 5 determines a reduced row address and/or a reduced column address, which identifies the column block and/or the row block in which the defective memory element is situated, and forwards these/this to the input of the first row memory array 59 and/or to the input of the first column memory array 60. Furthermore, the test device 1 passes the bank address PA, at which the defective memory element is situated, to the input of the first bank memory array 58. At the same time, the first valid bit VB1 in the first value memory 57 of the comparison device 6 is set to the value 1 by acceptance of the fixed value 1 which is applied to its input.

The first address comparison device 61 compares the new bank address, which is to be written to the first bank memory array 58, with the bank address previously stored in the first bank memory array 58. If the addresses correspond, then a 1 is forwarded as bank value BE1 to the evaluation unit 7. If the addresses are different, then a 0 is forwarded as bank value BE1 to the evaluation unit 7. The second address comparison device 62 compares the address that is to be newly written to the first row memory array 59 with the address previously stored in the first row memory array 59. If the two addresses correspond, then the value 1 is transferred as row value RE1 to the evaluation unit 7. If the addresses do not correspond, then a 0 is transferred as row value RE1 to the evaluation unit 7.

The third address comparison device 63 compares the address that is to be newly written to the first column memory array 60 with the address previously stored in the first column memory array 60. If the comparison reveals that the addresses correspond, then the third address comparison device 63 passes a 1, otherwise a 0, as column value CE1 to the evaluation unit 7.

The address previously stored in the first value memory 57, in the first bank memory array 58, in the first row memory array 59, and in the first column memory array 60 is respectively applied to the input of the second value memory 64, of the second bank memory array 65, of the second row memory array 66, and of the second column memory array 67.

The fourth, fifth, and sixth address comparison devices 68, 69, 70 evaluate the second bank memory array, the second row memory array 66, and the second column memory array 67, respectively, in accordance with the first memory row and pass the result to the first, second, and third AND comparison devices 71, 72, 73.

Equally, the data in the $k^{th}$ value memory 76, in the $k^{th}$ bank memory array 77, in the $k^{th}$ row memory array 78, and in the $k^{th}$ column memory array 79 are evaluated by the seventh, eighth, and ninth address comparison devices 80, 81 and 82 and the results of the seventh, eighth, and ninth address comparison devices are forwarded to the first, second, and third AND comparison devices 71, 72, 73.

All two to $k^{th}$ memory rows operate in the manner described.

Equally, the two to k value memories 64, 76 are evaluated by the fourth AND comparison device 75 and the result is forwarded as value bit signal VBR to the evaluation unit 7.

The output signal of the first AND comparison device is designated as bank evaluation signal BER, the output signal of the second AND comparison device is designated as row evaluation signal RER, and the output signal of the third AND comparison device 73 is designated as column evaluation signal CER.

Figure 3:
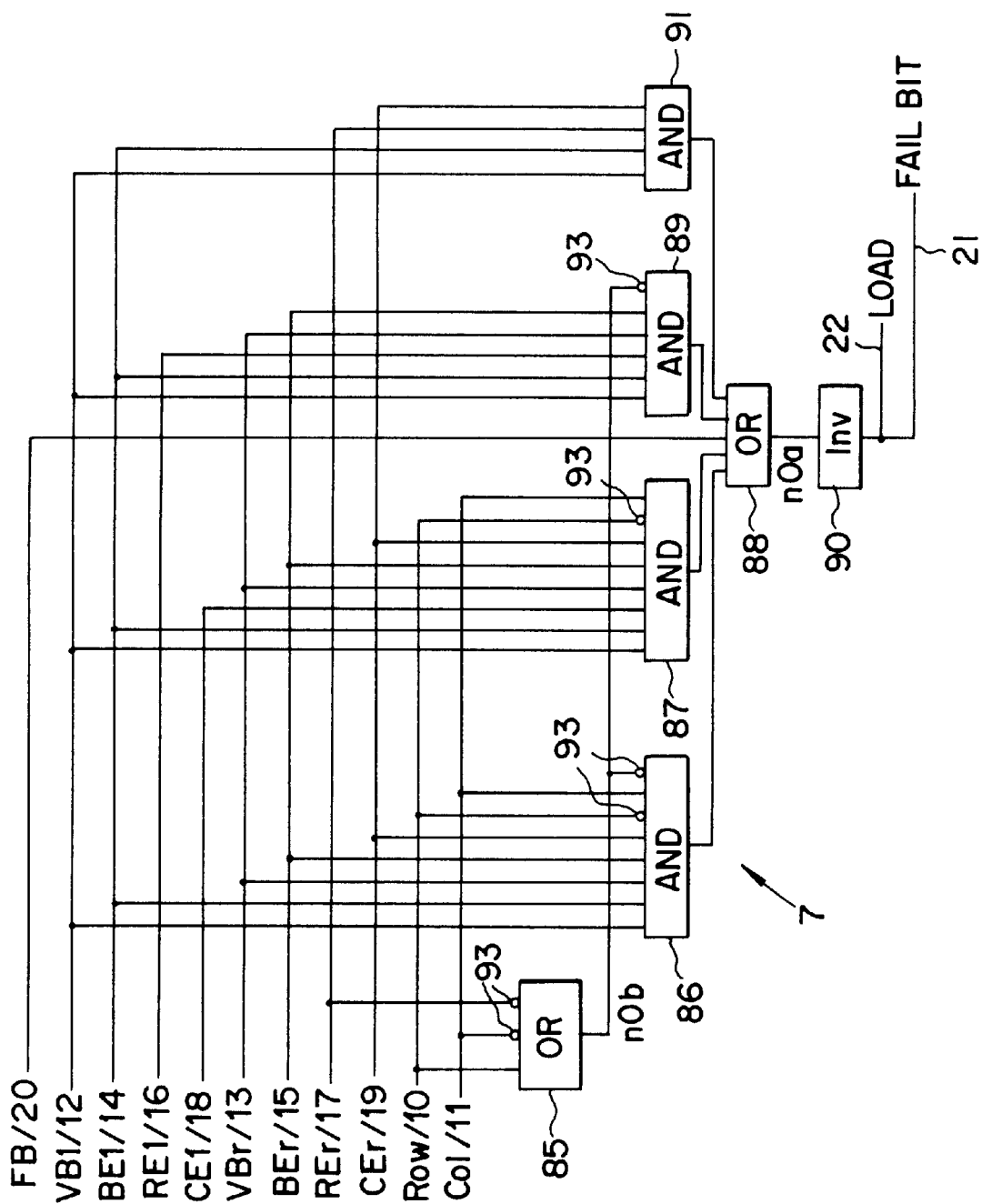
FIG. 3 is a block circuit diagram of an embodiment of the evaluation unit of FIG. 1.

FIG. 3 shows the construction of the evaluation unit 7, which has a first and a second OR gate 85, 88. Furthermore, the evaluation unit 7 has a first, a second, a third, and a fourth AND gate 86, 87, 89, 91. Moreover, a first and a second inverter 90, 93 are provided. The eleventh input 20, which carries the signal for the defect bit FB, is directly connected to the second OR gate 88. The third input 12, which carries the signal for the first valid bit VB1, is connected to the first AND gate 86, the second AND gate 87, the third AND gate 89, and the fourth AND gate 91. The fifth input 14, which carries the signal for the bank value BE1, is connected to the first, second, third, and fourth AND gates 86, 87, 89, 91. The seventh input 16, which carries the signal for the row value RE1, is connected to the third AND gate 89. The ninth input 18, which carries the signal for the column value CE1, is connected to the second AND gate 87. The fourth input 13, which carries the value bit signal VBR, is connected to the first, second, and third AND gates 86, 87, 89. The sixth input 15, which carries the bank evaluation signal BEr, is connected to the first, second, and third AID gates 86, 87, 89.

The eighth input 17, which carries the row evaluation signal REr, is connected through a second inverter 93 to the first OR gate 85 and to the fourth AND gate 91. The tenth input 19, which carries the column evaluation signal CEr, is connected to the first, second, and fourth AND gates 85, 87, 91. The first input 10, which carries the row information item ROW, is connected to the first OR gate, through a second inverter 93 to the first AND gate 86, and through a second inverter 93 to the second AND gate 87. The second input 11, which carries the column information item COL, is connected through a second inverter 93 to the first OR gate 85 and to the first and second AND gates 86, 87.

The output signal of the first OR gate 85 is connected through a second inverter 93 to the first AND gate 86 and through a further second inverter 93 to the third AND gate 89.

The outputs of the first, second, third, and fourth AND gates 86, 87, 89, 91 are respectively connected to inputs of the second OR gate 88. The output signal of the second OR gate 88 is passed to the input of the first inverter 90. The output signal of the first inverter 90 is connected to the first and second outputs 21, 22. The signal of the first output 21 is designated by Fail bit and the signal of the second output 22 is designated by Load.

The logic switching function of the evaluation unit 7 illustrated in FIG. 3 corresponds to the following logic function.

The switching function reads as follows, using the auxiliary signals n0a and n0b:

$$fail\ bit = Load = \overline{n0a}$$

$$n0a = (VB1 \wedge BE1 \wedge Vbr \wedge BEr \wedge CEr \wedge \overline{row} \wedge col \wedge \overline{n0b}) \vee$$
$$(VB1 \wedge BE1 \wedge CE1 \wedge VBr \wedge BEr \wedge CEr \wedge \overline{row} \wedge col) \vee$$
$$(VB1 \wedge BE1 \wedge RE1 \wedge VBr \wedge BEr \wedge \overline{n0b}) \vee$$
$$(VB1 \wedge BE1 \wedge RE1 \wedge CE1) \vee \overline{FB}$$

$$n0a = col \vee \overline{row} \vee REr$$

FIG. 4 shows a function table of the circuit configuration of FIG. 3. In FIG. 4, values for the signals are entered only insofar as these values are of importance for the assessment. Consequently, an absent 0 or 1 means only that these values are not of importance. The mode of operation of the circuit configuration according to the invention is explained using different signal states that are consecutively numbered on the left-hand side of the diagram and are produced depending on the defect state of a semiconductor memory in the circuit configuration of FIG. 3. The mode of operation of the circuit configuration of FIG. 3 is explained below using the individual signal states as indicated in the left-most column.

In signal state 1, the Fail bit (FB) of the test device 1 has the value 0. As a result, the Fail bit indicates that the address newly supplied by the test device 1 does not represent a defect address. Therefore, the new address is not written to the first bank memory array 58, the first row memory array 59, and the first column memory array 60 because the evaluation unit 7 outputs the signal Load=0 through the first output 21. Moreover, the evaluation unit 7 outputs, through the second output 22, a logic 0 indicating that the address is not a defect address.

The second address, which, in signal state 2, is forwarded by the test unit 1 to the comparison device 6 and the evaluation unit 7, represents a defect address because the Fail bit is allocated the value 1. The valid bit 1 VB1 indicates with the value 0 that valid defect addresses have not yet been stored hitherto in the first bank memory array 58, in the first row memory array 59, and in the first column memory array 60. Therefore, the evaluation unit 7 outputs a Load signal with the value 1 at the first output 21, so that the previously entry in the $k^{th}$ address array, which includes the $k^{th}$ bank memory array, the $k^{th}$ row memory array, and the $k^{th}$ column memory array, is shifted into the $(k+1)^{th}$ address array with the $(k+1)^{th}$ bank memory array, the $(k+1)^{th}$ row memory array, and the $(k+1)^{th}$ column memory array. The new address is subsequently written to the first bank memory array, the first row memory array, and the first column memory array 58, 59, 60. At the same time, the evaluation unit 7 outputs a Fail bit with the value 1 through the second output 22, so that the storage unit 8 receives the indication that the address is a defect address. The storage unit 8 stores the address in the external defect memory 9.

In state 3, the newly supplied address, again, represents a defect address and a valid defect address is stored (VB1=1)

in the first address array, which includes the first bank memory array 58, the first row memory array 59, and the first column memory array 60. However, because the bank value BE1 has the value 0, the condition indicates that the defect addresses are disposed in different banks. Consequently, the new address is accepted into the first address array (Load=1) and relayed as defect address from the evaluation unit 7 to the storage unit 8 (Fail bit=1). At the same time, the defect address previously stored in the first address array is advanced into the second address array, the second address array including the second bank memory array 65, the second row memory array 66, and the second column memory array 67.

The storage unit 8 respectively stores the address newly supplied by the test device 1, upon receiving a Fail bit signal from the evaluation unit 7 with the value 1, as defect address in the external defect memory 9. After the semiconductor module has been checked, the external defect memory 9 has all the addresses of defective memory cells.

In state 4, the new address supplied to the comparison device 6 by the test device 1 represents a defect address. The defect address lies in the same memory bank as the defect address that was previously written to the first address array (BE1=1). However, the defective memory cells are situated in different row and column blocks (RE1=0, CE1=0). Consequently, the two defective memory cells can never be repaired by the same replacement block. Consequently, the new defect address must be written to the first address array of the comparison device 6 (Load=1) and be relayed as defect address to the storage unit 8 (Fail bit=1). Before the new defect address is stored in the first address array, the defect address previously stored in the first address array is transferred into the second address array, which includes the second bank memory array 65, the second row memory array 66, and the second column memory array 67. The defect address stored in the $k^{th}$ address array is transferred into the $(k+1)^{th}$ address array.

In state 5, a new address is supplied as defect address (FB=1) with the same bank address (BE1=1) and with the same column block address (CE1=1) as the defect address stored in the first address array. Because all the memory arrays of the comparison device 6 are not yet filled with valid defect addresses, there are not yet present more than k defect addresses with the same bank and column block address. Consequently, the new defect address must be accepted into the first address array (Load=1) and be relayed as defect address to the storage unit 8 (Fail bit=1). The defect address previously stored in the first address array is transferred into the second address array and the defect address previously stored in the second address array is transferred into the third address array. A corresponding procedure is followed with all defect addresses that are stored in one of the address arrays of the comparison device 6.

In state 6, the new address is again a defect address and all the memory arrays of the comparison device 6 are filled with valid defect addresses (VB1=1, VBr=1). However, the bank addresses of the stored defect addresses lie in different memory banks (BEr=0). Consequently, what are involved cannot, therefore, be k defect addresses that represent defective memory cells that can be repaired by a common row block exchange or column block exchange. The new defect address is, thus, relayed as defect address to the storage unit 8 (Fail bit=1) and accepted into the first address array of the comparison device 6 (Load=1). At the same time, the memory addresses previously stored in the address arrays are advanced by an address array.

In state 7, the new address supplied to the comparison device 6 by the test device 1 is again a defect address (FB=1). The new defect address and all the defect addresses stored in the address arrays of the comparison device 6 represent defective memory cells situated in the same memory bank (VB1=1, VBr=1). However, neither all the column block addresses nor all the row block addresses of the defect addresses stored in the address arrays of the comparison device 6 correspond to the column block address or the row block address of the new defect address (REr=0, CEr=0). Consequently, the new defect address is written to the first address array of the comparison device 6. At the same time, the new defect address is relayed as address to be stored to the storage unit 8.

In state 8, the newly supplied address is, again, a defect address. Bank addresses and column block addresses of all the defect addresses stored in the memory arrays of the comparison device 6 correspond to the bank address and the column block address of the new defect address (BE1=1, BEr=1, CE1=1, CEr=1). However, in the processing of the defect addresses, an operating mode has been chosen in which no address reduction is carried out (row=0, col=0). Consequently, regardless of the correspondence to preceding defect addresses, the new defect address is to be stored as defect address in the first address array of the comparison device 6 and is to be stored as defect address in the external defect memory 9 by the storage unit 8 (Fail bit=1, Load=1).

In state 9, the new address is a defect address. The bank addresses and column block addresses of all the defect addresses stored in the memory arrays of the comparison device 6 correspond to the bank address and the column block address of the new defect address (BE1=1, BEr=1, CE1=1, CEr=1). The column block address test was chosen as the processing mode (row=0, col=1). The evaluation unit 7 recognizes that the number k of defect addresses of a column have already been determined and, therefore, the new defect address is not relayed to the storage unit 8 and is not written to the first address array of the comparison device 6 (Load=0, Fail bit=0). If k defect addresses of a column have already been found, then the column can no longer be repaired with replacement row blocks if only (k−1) replacement row blocks are provided. Consequently, the storage of the $(k+1)^{th}$ defect address is without further useful information. The result is already fixed with the $k^{th}$ defect address. A replacement column block is to be used for the repair.

In state 10, the new address is again a defect address. The operating mode (row=1) chosen was the procedure in which the test device 1 holds the row and, for a row, checks all column addresses in order. In such a case, a comparison is made to determine whether or not the bank address and the row block address of the new defect address correspond to the bank addresses and the row block addresses of all the defect addresses stored in the address arrays of the comparison device 6. Such is not the case (RE1=0), however, with the defect address that is stored in the first address array.

Consequently, the new defect address is written to the first address array and relayed as defect address to the storage unit 8 (Fail bit=1, Load=1).

In state 11, the address passed from the test device 1 to the comparison device 6 is again a defect address (FB=1). The new defect address lies in the same memory bank as all the defect addresses previously stored in the address arrays (BE1=1, BEr=1). Moreover, the new defect address has the same column block address as the defect address stored in the first address array (CE1=1), but a different row block address (RE1=0). Because the column block addresses of all defect addresses stored in the address arrays are not identical (CEr=0), defect address reduction is not possible in such a case either. The new defect address is written to the first address array and relayed as defect address to the storage unit 8 (Fail bit=1, Load=1).

In state 12, the new address is again a defect address (FB=1). However, in the test device 1, an operating mode was chosen in which no address reduction is carried out (row=0, col=1) and the new defect address is not identical to the address stored in the first address array. Consequently, the new defect address must be stored in the first address array and relayed as defect address to the storage unit 8 (Fail bit=1, Load=1).

In state 13, the address newly supplied by the test device 1 is again a defect address (FB=1). The bank address and the column block address of the new defect address correspond to the bank address and the column block address of all the defect addresses stored in the address arrays of the comparison device 6 (CE1=1, CEr=1) and a column block address comparison was chosen by the test device 1 as operating mode for checking the defect addresses (row=0, col=1).

The evaluation unit 7 recognizes that the number k of defect addresses of a column have already been determined and, therefore, the new defect address is not relayed to the storage unit 8 and is not written to the first address array of the comparison device 6 (Load=0, Fail bit=0). If k defect addresses of a column have already been found, then the column can no longer be repaired with replacement row blocks if only (k−1) replacement row blocks are provided. Consequently, the storage of the $(k+1)^{th}$ defect address is without further useful information. The result is already fixed with the $k^{th}$ defect address. A replacement column block is to be used for the repair.

In state 14, the new address is a defect address and the row block address of the defect address does not correspond to the row block address of the defect address stored in the first address array of the comparison device 6. However, because an operating mode with row block address comparison is chosen (row=1), in which the row is held and all the columns of the row are checked with regard to a defect address, the new defect address is relayed as defect address to the storage unit 8 (Fail bit=1) and written to the first address array (Load=1).

In state 15, the new defect address has a bank address and a row block address that corresponds to the row block address and the bank address of the defect address stored in the first address array (BE1=1, RE1=1). However, not all of the address arrays of the comparison device 6 are completely filled with valid defect addresses. Consequently, the new defect address is written to the first address array and relayed as defect address to the storage unit 8 (Fail bit=1, Load=1).

In state 16, the address newly supplied by the test device 1 is a defect address (FB=1) and all the address arrays of the comparison device 6 are completely filled with valid defect addresses (VB1=1, VBr=1). However, the bank addresses of the stored defect addresses lie in different memory banks (BEr=0). Consequently, what are involved cannot be k defect addresses that represent defective memory cells that can be repaired by a common row block exchange or column block exchange. As such, the new defect address must be stored in the first address array (Fail bit=1) and relayed as defect address to the storage unit 8.

In state 17, the newly supplied address is again a defect address. The new defect address and all defect addresses stored in the address arrays of the comparison device 6 represent defective memory cells that are disposed in the same memory bank (VB1=1, VBr=1). However, neither all the memory block addresses nor all the row block addresses of the defect addresses stored in the memory of the processing unit correspond to the column block address or row block address of the new defect address (REr=0, CEr=0). Consequently, the new defect address is stored in the first address array and relayed as defect address to the storage unit 8 (Fail bit=1, Load=1).

In state 18, the new address is again a defect address. The bank address and row block address of the defect address stored in the first address array correspond to the bank address and the row block address of the new defect address (BE1=1, RE1=1). However, the row block address of the new defect address does not correspond to the row block addresses of the remaining defect addresses stored in the 2 to $k^{th}$ address arrays. Consequently, the new defect address is relayed as defect address to the storage unit 8 and stored in the first address array (Fail bit=1, Load=1).

In state 19, the new address constitutes a defect address (FB=1). The bank address and the row block address of the new address correspond to the bank address and the row block address of all the defect addresses stored in the address arrays of the comparison device 6 (BE1=BEr=RE1=REr=1), but the column test was switched off (row=0). Consequently, the new defect address is forwarded as defect address to the storage unit 8 and accepted into the first address array of the processing unit (Load=1, Fail bit=1).

In state 20, the new defect address has a bank address and a row block address that corresponds to the bank addresses and row block addresses of all the defect addresses stored in the address arrays of the comparison device 6 (BE1=BEr=RE1=REr=1) and a row test was switched on as operating mode (row=1).

The evaluation unit 7 recognizes that the number k of defect addresses of a row block have already been determined and, therefore, the new defect address is not relayed to the storage unit 8 and is not written to the first address array of the comparison device 6 (Load=0, Fail bit=0). If k defect addresses of a row block have already been found, then the column can no longer be repaired with replacement column blocks if only (k−1) replacement column blocks are provided. Consequently, the storage of the $(k+1)^{th}$ detect address is without further useful information. The result is already fixed with the $k^{th}$ defect address. A replacement row block is to be used for the repair.

In state 21, the new defect address has a bank address and a row block address that corresponds to the bank address and the row block address of all the defect addresses stored in the address arrays of the comparison device 6 (BE1=BEr=RE1=REr=1). However, the column block address of the new defect address does not correspond to the column block address of the defect address stored in the first address array (CE1=0). Because the operating mode switched on is a column test (col=1), in which all the rows of a column are checked, the new defect address must be forwarded as defect address to the storage unit 8 and be stored in the first address array of the comparison device 6 (Fail bit=1, Load=1).

In state 22, the new defect address corresponds, with regard to the bank address and the row block address, to all defect addresses stored in address arrays of the comparison device 6. Because the row comparison is switched off, the new defect address is forwarded to the storage unit 8 and written to the first address array (Fail bit=1, Load=1).

In state 23, the new defect address corresponds, with regard to the bank address and the row block address, to the bank address and the row block address of all the defect addresses stored in the address arrays of the comparison device 6 (BE1=BEr=RE1=REr=1) and, moreover, a row test was switched on as operating mode (row=1).

The evaluation unit 7 recognizes that the number k of defect addresses of a row block have already been determined and, therefore, the new defect address is not relayed to the storage unit 8 and is not written to the first address array of the comparison device 6 (Load=0, Fail bit=0). If k defect addresses of a row block have already been found, then the column can no longer be repaired with replacement column blocks if only (k−1) replacement column blocks are provided. Consequently, the storage of the $(k+1)^{th}$ defect address is without further useful information. The result is already fixed with the $k^{th}$ defect address. A replacement row block is to be used for the repair.

In state 24, the new defect address corresponds, with regard to the bank address and its block address, to all defect addresses stored in the address arrays of the comparison device 6 (BE1=BEr=RE1=REr=1). However, the new defect address does not correspond, with regard to the column block address, to the defect address stored in the first address array (CE1=0). Because a column test is provided for testing the semiconductor module (col=1), during which test all the rows of a column are checked, the new defect address must be forwarded to the storage unit 8 as defect address and be stored in the first address array (Load=1, Fail bit=1).

In state 25, the new defect address is identical to the defect address stored in the first address array (BE1=CE1=RE1=1). Consequently, the new defect address is not relayed to the storage unit 8, nor is it stored in the first address array of the comparison device 6; thus ensuring that a plurality of defects in the same area of the memory matrix are detected multiply one after the other, the area being defined by the crossover of a row block and column block.

In the description above, new defect address in each case designated the address that was passed on as new address to the comparison device 6 by the test device 1. Depending on the embodiment, the addresses can be processed with regard to the column address and row address with the complete address or, when using the preprocessing unit 5, it is also possible to use the row block address and/or the column block address of the defective memory cell. The use of the row block address and/or of the column block address makes it possible to further reduce the data that is to be stored and processed further. Reduction to the row block address and/or the column block address can be carried out without a loss of information because, when a defective memory cell is repaired, a multiplicity of memory cells in the form of a row block or a column block are repaired in each case. The storage unit 8 stores each new reported address in the external defect memory 9.

FIG. 5 shows a memory array having 8×8 memory cells, in each case, two rows and two columns forming a row block and a column block, respectively. Redundant columns 1 and 2 and redundant rows 1 and 2 are additionally provided in the memory module. Consequently, a redundant column block and a redundant row block are provided respectively for a repair of defective cells. In FIG. 5, a defective memory cell is disposed respectively in row 1 and in row 2 in column 5. Moreover, a defective memory cell is disposed in row 1 and in row 3 in column 8. FIG. 5 shows a memory bank of a memory module. The method according to the invention not only compares the column addresses in the corresponding operating mode in which all the rows of a column are checked (row=0, col=1) with the defect addresses already stored in the comparison device 6, rather the row address of the new address is also compared with the row address of the defect address stored in the first address array. If the bank address, the row block address, and the column block address correspond, then the defect address is not accepted as new defect address (state 25 of the function table of FIG. 4). As a result, the defective memory cells in column 5, rows 1 and 2, which have identical row block and column block addresses, are not multiply accepted into the address arrays of the comparison device 6 and are, thus, not counted twice. Consequently, the check of the memory bank illustrated in FIG. 5 yields the result that it is possible to repair the defective memory cells with a replacement row block and with a replacement column block. In the exemplary embodiment illustrated, in which only one replacement row block and one replacement column block are provided in each case, the number k of address arrays of the comparison device 6 is limited to the number 2.

If a check of the memory bank reveals that more than one replacement column block or one replacement row block are necessary for repairing the memory bank, then the memory bank cannot be repaired.

The evaluation unit 7 outputs a defect bit (Fail bit) to the storage unit 8 or the comparison device 6 and a load signal to the storage unit 8 if:

1. The test device reports a defect bit FB and no data has previously been stored in the memory configuration of the comparison device 6. Such a state is identified by the value of the first valid bit VB1=0. The state corresponds, for example, to the second line of the table;
2. The first memory row is already occupied (VB1=1) and the bank address (BE1=1) corresponds but neither the row address (RE1) nor the column address (CE1) corresponds to the defect address previously stored in the first memory row.

If the number of defect addresses lies above the number of the number k of replacement blocks available for the repair, then the entire column must be replaced. The information that the column must be replaced is stored such that defect addresses are stored for a column k. In such a case, the number of repair blocks is k−1.

One advantage of the invention is that a memory configuration with memory rows is provided, the memory rows being connected serially one after the other. A memory row includes all the addresses of an address array. Moreover, a respective memory array is provided respectively for a bank address, a row address, and a column address. Furthermore, an address comparison device is provided for each bank memory array, row memory array, and column memory array. Moreover, a check is made to determine whether or not it is not already the case that a predetermined number k of row or column addresses have already been found as defect address for the same bank address. If such is the case, then no defect bit is output.

The address comparison devices of the two to $k^{th}$ memory rows for the bank address, row address, and column address, respectively, are each connected to an AND comparison device. As such, it is possible to ascertain, in a simple form, whether or not the number k−1 of defect addresses have already been stored per row or per column.

The volume of data of the defect addresses is preferably reduced in such a way that:

1. only address blocks and not individual addresses are considered;
2. for a row or a column, only the number k of defect block addresses are stored for which (k−1) replacement column blocks or replacement row blocks are available for repair.

If there are more than (k−1) defective row blocks per column or column blocks per row, then the defective memory element is repaired by a replacement column block or a replacement row block, respectively.

For the further defect evaluation, to be able to decide whether or not the repair has to be effected by a replacement row block or a replacement column block, it is not important to know that there are more than k defective row blocks or column blocks per column or per row, respectively, with the result that only the addresses of k defective row blocks or column blocks are stored.

The invention has been described using the example of a bank address, row address, and column address. in the simplest case, the defect addresses can be checked using just one address. The column address suffices in the case of column-by-column checking of the semiconductor memory, and the row address suffices in the case of row-by-row checking. The number of k memory rows connected in series can be chosen individually depending on the application. Instead of the configuration described in the exemplary embodiment, it is also possible to choose a different division of the functions between the individual components. Moreover, a realization with the aid of programs that realize the functions of the modules represented is also possible.

A semiconductor memory has been described as the component in the exemplary embodiment described, but the invention can be applied to all types of memory components in which a reduction of the stored defect addresses is desired.

I claim:

1. A method for processing addresses of defective elements of a memory component, which comprises:
   a) checking the memory component for a correct mode of operation with a predetermined test program;
   b) comparing an address of an element with predetermined address ranges;
   c) assigning the address to an address range;
   d) using the address of the address range to which the address was assigned for the element;
   e) comparing the address of the defective element with defect addresses of elements already identified as defective if an element of the memory component is identified as defective;
   f) storing the address as a new defect address if the address does not correspond to one of the defect addresses; and
   g) not storing the new address if the address corresponds to one of the defect addresses.

2. The method according to claim 1, which further comprises:
   comparing the address with the defect address stored last as a defect address;
   comparing with one another a predeterminable number k of defect addresses stored last; and
   not storing the address as a defect address if the address corresponds to the defect address stored last and if the address corresponds to the last k stored defect addresses.

3. The method according to claim 1, which further comprises using one of a column address and a row address of a memory element as the address in a matrix-type semiconductor memory.

4. The method according to claim 2, which further comprises using one of a column address and a row address of a memory element as the address in a matrix-type semiconductor memory.

5. An apparatus for processing addresses of defective elements determined by a test apparatus, comprising:
   an evaluation unit;
   a comparison device connected to said evaluation unit and having:
      a memory configuration with memory arrays connected in series; and
      comparitors for comparing a newly determined address with an address stored in a first of said memory arrays, some of said comparitors respectively provided for two of said memory arrays one connected downstream of another, said some comparitors comparing addresses stored in said two memory-arrays, said some comparitors forwarding an evaluation signal to said evaluation unit if the addresses correspond;
   a defect memory; and
   said evaluation unit outputting a command for storing the newly determined address in said defect memory and in said first memory array if the newly determined address does not correspond to the address stored in said first memory array.

6. The apparatus according to claim 5, wherein said comparison device advances an address previously stored in said first memory array into a second of said memory arrays if the newly determined address is written to said first memory array.

7. The apparatus according to claim 6, wherein a number k of said memory arrays are connected in series and the address previously stored in a $(k-1)^{th}$ memory array is advanced into a $k^{th}$ memory array if the newly determined address is read into said first memory array.

8. The apparatus according to claim 7, wherein said evaluation unit outputs a command for storing the newly determined address in said defect memory if the same addresses are not stored in a number k of successive ones of said memory arrays connected in series.

9. The apparatus according to claim 7, including:
   bank comparison devices;
   row comparison devices;
   column comparison devices;
   a bank evaluation circuit;
   a row evaluation circuit;
   a column evaluation circuit; and
   a decision circuit, and wherein:
      said memory configuration has memory rows;
      a number of k memory rows are connected in series;
      a respective one of said memory rows has three memory arrays including a bank address array, a row address array, and a column address array;
      said bank address arrays, said row address arrays, and said column address arrays of respective ones of said memory rows are connected in series;
      one of said bank comparison devices is respectively connected to two of said bank address arrays;
      one of said row comparison devices is respectively connected to every two of said row address arrays;
      one of said column comparison devices is respectively connected to every two of said column address arrays;
      all 2 to $k^{th}$ bank comparison devices are connected to said bank evaluation circuit;
      all 2 to $k^{th}$ row comparison device are connected to said row evaluation circuit;
      all 2 to $k^{th}$ column comparison device are connected to said column evaluation circuit; and said bank evaluation circuit, said row evaluation circuit, and said column evaluation circuit are connected to said decision circuit.

10. The apparatus according to claim 5, wherein a number k of said memory arrays are connected in series and the address previously stored in a $(k-1)^{th}$ memory array is advanced into a $k^{th}$ memory array if the newly determined address is read into said first memory array.

11. The apparatus according to claim 10, wherein said evaluation unit outputs a command for storing the newly determined address in said defect memory if the same addresses are not stored in a number k of successive ones of said memory arrays connected in series.

12. The apparatus according to claim 10, including:

bank comparison devices;

row comparison devices;

column comparison devices;

a bank evaluation circuit;

a row evaluation circuit;

a column evaluation circuit; and a decision circuit, and wherein:

said memory configuration has memory rows;

a number of k memory rows are connected in series;

a respective one of said memory rows has three memory arrays including a bank address array, a row address array, and a column address array;

said bank address arrays, said row address arrays, and said column address arrays of respective ones of said memory rows are connected in series;

one of said bank comparison devices is respectively connected to two of said bank address arrays;

one of said row comparison devices is respectively connected to every two of said row address arrays;

one of said column comparison devices is respectively connected to every two of said column address arrays;

all 2 to $k^{th}$ bank comparison devices are connected to said bank evaluation circuit;

all 2 to $k^{th}$ row comparison devices are connected to said row evaluation circuit;

all 2 to $k^{th}$ column comparison devices are connected to said column evaluation circuit; and said bank evaluation circuit, said row evaluation circuit, and said column evaluation circuit are connected to said decision circuit.

13. The apparatus according to claim 5, including a preprocessing unit connected to said comparison device and to said evaluation unit, said preprocessing unit receiving the addresses upstream of said comparison device, said preprocessing unit comparing the addresses with predetermined address ranges and assigning the addresses to an address range, and said preprocessing unit forwarding to said comparison device the address of the address range to which the address was assigned.

14. The apparatus according to claim 13, including:

bank comparison devices;

row comparison devices;

column comparison devices;

a bank evaluation circuit;

a row evaluation circuit;

a column evaluation circuit; and a decision circuit, and wherein:

said memory configuration has memory rows;

a number of k memory rows are connected in series;

a respective one of said memory rows has three memory arrays including a bank address array, a row address array; and a column address array;

said bank address arrays, said row address arrays, and said column address arrays of respective ones of said memory rows are connected in series;

one of said bank comparison devices is respectively connected to two of said bank address arrays;

one of said row comparison devices is respectively connected to every two of said row address arrays;

one of said column comparison devices is respectively connected to every two of said column address arrays;

all 2 to $k^{th}$ bank comparison devices are connected to said bank evaluation circuit;

all 2 to $k^{th}$ row comparison devices are connected to said row evaluation circuit;

all 2 to $k^{th}$ column comparison devices are connected to said column evaluation circuit; and said bank evaluation circuit, said row evaluation circuits and said column evaluation circuit are connected to said decision circuit.

* * * * *